United States Patent
Cideciyan et al.

(10) Patent No.: US 6,768,603 B2
(45) Date of Patent: Jul. 27, 2004

(54) PRECOMPENSATION TECHNIQUE AND MTR CODE FOR HIGH DATA RATE RECORDING

(75) Inventors: Roy Daron Cideciyan, Ruschlikon (CH); Evangelos Stavros Eleftheriou, Zurich (CH); Brian Harry Marcus, Los Altos, CA (US); Dharmendra Shantilal Modha, San Jose, CA (US); Radley Wahl Olson, Cupertino, CA (US)

(73) Assignee: International Business Machines Corporation, Armonk, NY (US)

( * ) Notice: Subject to any disclaimer, the term of this patent is extended or adjusted under 35 U.S.C. 154(b) by 329 days.

(21) Appl. No.: 09/799,492

(22) Filed: Mar. 7, 2001

(65) Prior Publication Data

US 2002/0126405 A1 Sep. 12, 2002

(51) Int. Cl.⁷ .................................... G11B 5/09
(52) U.S. Cl. ................................. 360/45; 360/40
(58) Field of Search .................... 360/45, 40, 51; G11B 5/09, 20/10, 20/14

(56) References Cited

U.S. PATENT DOCUMENTS

| | | | |
|---|---|---|---|
| 5,731,768 A | | 3/1998 | Tsang |
| 5,784,010 A | | 7/1998 | Coker et al. |
| 5,859,601 A | | 1/1999 | Moon et al. |
| 5,949,357 A | | 9/1999 | Fitzpatrick et al. |
| 6,009,549 A | * | 12/1999 | Bliss et al. ............ 714/769 |
| 6,201,779 B1 | * | 3/2001 | Reed .................... 369/59 |
| 6,288,858 B1 | * | 9/2001 | Arnett et al. ............ 360/45 |
| 6,356,402 B2 | * | 3/2002 | Igarashi et al. .......... 360/51 |

OTHER PUBLICATIONS

Ashley et al, "Time–Varying Encoders for Constrained Systems: An Approach to Limiting Error Propogation", IEEE Transactions on Information Theory, vol. 46, No. 3, May 2000, p. 1038.*

IBM Technical Disclosure Bulletin, "Improved Dibit (2,8) Code ", vol. 29, Issue N0. 2, Jul. 1986, pp. 507–509.*

Zachary A. Keirn and Steven G. McCarthy, *Experimental Performance of FDTS/DF Detectors: 8/9(O,k) v. 4/5 MTR Codes*, IEEE Transactions on Magnetics, vol. 33, No. 5, Sep. 1997.

Steven G. McCarthy and Zachary A. Keirm, *Distance Enhancing Codes for E²PRML: Performance Comparison using Spinstand Data*, IEEE Transactions on Magnetics, vol. 33, No. 5, Sep. 1997.

* cited by examiner

Primary Examiner—David Hudspeth
Assistant Examiner—Dan I Davidson
(74) Attorney, Agent, or Firm—Joseph P. Curtin; Banner & Witcoff, Ltd.

(57) ABSTRACT

A method for write-precompensating a waveform for magnetically recording a waveform on a magnetic medium is disclosed. A user data stream is encoded into an encoded data stream so that the encoded data stream has no tribits and no consecutive dibits. No delay is applied to a first transition of a dibit of the encoded data stream. An isolated transition of the encoded data stream is delayed by a first predetermined amount of time. The second transition of a dibit of the encoded data stream is delayed by a second predetermined amount of time, such that the second predetermined amount of time is substantially twice the first predetermined amount of time. Preferably, the encoded data stream satisfies a predetermined run length limited (RLL) k– constraint of k=13 and a predetermined twins t-constraint of t=15. In one embodiment, the encoded data stream is encoded by a block code at rate 8:10. In another embodiment, the encoded data stream is encoded by a block code at rate 16:19.

9 Claims, 4 Drawing Sheets

PRECOMPENSATION TECHNIQUE AND MTR CODE FOR HIGH DATA RATE RECORDING

BACKGROUND OF THE INVENTION

1. Field of the Invention

The present invention relates to the field encoding and decoding of constrained codes. More particularly, the present invention relates to write precompensation techniques, in conjunction with Maximum Transition Rate (MTR) codes, for high data rate recording applications.

2. Description of the Related Art

According to the NRZI magnetic recording convention, a "1" is recorded as a transition in magnetic polarity, and a "0" as the absence of a transition in magnetic polarity. Nearby 1's can interfere with one another, thereby causing intersymbol interference (ISI). In very high density magnetic recording, nearby 1's can interfere nonlinearly resulting in another deleterious effect, known as nonlinear transition shift (NLTS), in which, for example, the second transition in a string of two consecutive transitions is attracted closer to the first transition (i.e., moved earlier in time) than if the transition had been written as an isolated transition. Moreover, a string of successive nearby transitions may cause the write head to change polarity so fast that the write head may not reach a steady state after each transition, resulting in under-saturation of the medium.

These detrimental effects can be mitigated using two different techniques: maximum transition run (MTR) coding and write precompensation. An MTR(j) code limits the maximum number of consecutive transitions to j. In other words, an MTR(j) forbids the appearance of j+1 consecutive 1's. For instance, the most extreme version of MTR coding is MTR(j=1), which allows only isolated transitions. That is, an MTR(j=1) code forbids the appearance of the string "11", which is known as a dibit. An MTR(j=1) code is also known as a run length limited (RLL) code having a d=1 constraint. Such an MTR code, however, carries a significant code penalty, leading to either a lower user density or difficulty with timing recovery. The code rate for an MTR(j=1) a code can be at most 0.6942.

A less extreme version of an MTR code is an MTR(j=2) code that allows isolated transitions and dibits, but forbids tribits, i.e., "111". Such a constraint permits a much higher code rate (potentially up to 0.8792). MTR(j=2) codes were originally introduced by J. Moon and B. Brickner for increasing code distance, and therefore enhancing performance of extended partial response channels. See J. Moon et al., "Maximum transition run codes for data storage systems," IEEE Trans. on Magnetics, Vol. 32, pp. 3992–3994, September 1996.

More recently, many new MTR codes, and variants thereof, have been introduced. See, for example, U.S. Pat. No. 5,731,768 to Tsang, W. G. Bliss, "An 8/9 rate time-varying trellis code for high density magnetic recording," IEEE Trans. on Magnetics, Vol. 33, pp. 2746–2748, September 1997; W. G. Bliss et al., "The performance of generalized maximum transition run trellis codes," IEEE Trans. on Magnetics., Vol. 34, part I, pp. 85–90, January 1998; B. Brickner et al, "Design of a rate 6/7 maximum transition run code," IEEE Trans. on Magnetics., vol. 33, part I, pp. 27–49–2751, September 1997; and K. K. Fitzpatrick et al., "Time-varying MTR codes for high density magnetic recording," in Proc. IEEE Global Telecommun, Conf., pp. 1250–1255, November 1997.

While limiting the number of consecutive transitions is important, it is also important to limit the maximum length of strings, such as 000000 . . . and 001100110011 . . . Limiting the length of a string, such as 000000 . . . , known as the RLL k-constant, is essential for timing recovery. Limiting the length of a string, such as 001100110011 . . . , known as the twins t-constraint, is essential for limiting path memory in a Viterbi detector for partial response channels.

For write precompensation, the second technique for mitigating ISI, NLTS and under saturation of the medium, the second transition in a string of two consecutive transitions is delayed. For strings of three or more consecutive transitions, a more complicated write precompensation schedule is used for mitigating NLTS. The performance of such a scheme depends on accurate measurement of NLTS.

Experimental evaluation of MTR(j=2) codes in conjunction with conventional write precompensation schemes are disclosed by Z. A. Keim et al., "Experimental Performance Comparison of FDTS/DF Detectors: 8/9 (0, k) vs. 4/5 MTR Codes," IEEE Trans. on Magnetics, Vol. 33, 2731 (1998), and S. G. McCarthy et al., "Distance Enhancing Codes for EEPRML: Performance Comparison Using Spinstand Data," IEEE Trans. Magnetics, Vol. 33, 2734 (1998).

Thus, what is needed is a simple technique for cleanly writing consecutive dibits at a high data rate that combines a write precompensation technique with an MTR code.

SUMMARY OF THE INVENTION

The present invention provides a simple technique for cleanly writing consecutive dibits at a high data rate that combines a write precompensation technique with an MTR code.

The advantages of the present invention are provided by a method for write-precompensating a waveform for magnetically recording a waveform on a magnetic medium. According to the invention, a user data stream is encoded into an encoded data stream so that the encoded data stream has no tribits and no consecutive dibits. No delay is applied to a first transition of a dibit of the encoded data stream. An isolated transition of the encoded data stream is delayed by a first predetermined amount of time. The second transition of a dibit of the encoded data stream is delayed by a second predetermined amount of time, such that the second predetermined amount of time is substantially twice the first predetermined amount of time. The first and second predetermined amounts of time are selected so that the closest interdibit transition of the encoded data stream becomes about equal to a distance between two neighboring intradibit transitions of the encoded data stream. Preferably, the encoded data stream satisfies a predetermined run length limited (RLL) k-constraint of k=13 and a predetermined twin t-constraint of t=15. In one embodiment of the present invention, the encoded data stream is encoded by a block code at rate 8:10. In another embodiment of the present invention, the encoded data stream is encoded by a block code at rate 16:19.

Preferably, the user data stream is encoded based on a time-varying technique that alternates between a first phase and a second phase, the first phase being an 8:9 phase and the second phase being an 8:10 phase. The encoded data stream is then decoded using a sliding-block technique having a window consisting of two blocks that alternate between a 9-bit block followed by a 10-bit block and a 10-bit block followed by a 9-bit block.

BRIEF DESCRIPTION OF THE DRAWING

The present invention is illustrated by way of example and not limitation in the accompanying figures in which like reference numerals indicate similar elements and in which.

DETAILED DESCRIPTION

The present invention provides a write precompensation technique for use with an MTR code. The precompensation technique of the present invention writes the first transition in a dibit early (with respect to the "tick" of a write clock) and the second transition in a dibit late (with respect to the "tick" of a write clock). The MTR code of the present invention forbids tribits (i.e., "111") and consecutive dibits (i.e., "11011"). The combination of the precompensation technique of the present invention and the MTR code of the present invention mitigates the effects of NLTS and undersaturation of the recording medium, thereby allowing dibits to be written cleanly at high data rates. Thus, the present invention provides a lower readback soft error rate than the conventional precompensation techniques used throughout the disk drive industry.

According to the present invention, when the channel clock period is less than the head field rise time, a dibit is written by separating the two transitions in the dibit in time by applying a "symmetric" time shift technique to each transition. Separating the two transitions in time is achieved by writing the first transition of the dibit earlier than the corresponding channel clock "tick", and by writing the second transition later than the corresponding channel clock "tick". The "symmetric" time shift applied to each respective transition is preferably the same, but in an opposite direction, so that the center of the written precompensated dibit is not shifted.

Figure 1:
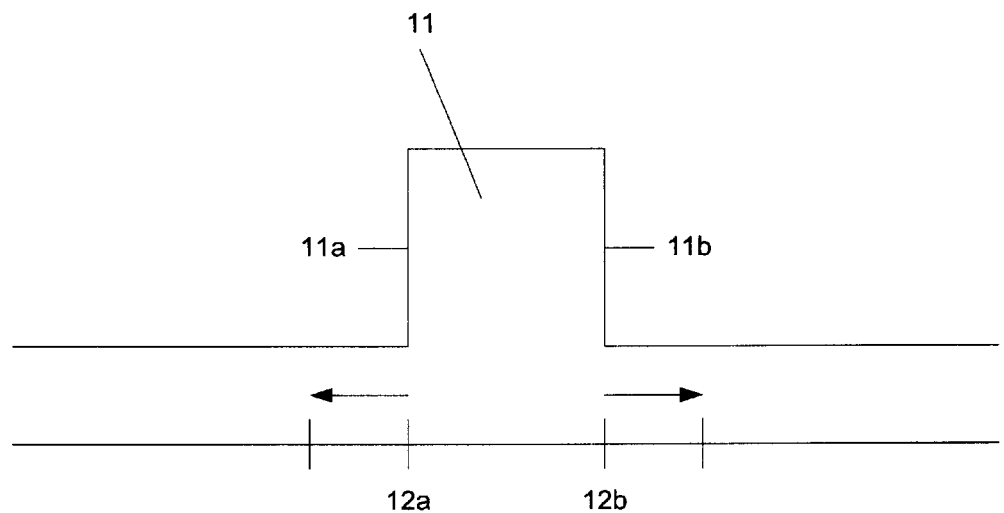
FIG. 1 shows a timing diagram showing the write precompensation technique according to the present invention.

FIG. 1 shows a diagram 10 showing the write precompensation technique according to the present invention. In FIG. 1, a dibit 11 that is to be written is shown synchronized with clock ticks 12 of a write clock. A predetermined time shift is applied to the bit 11a of the dibit so that bit 11a is advanced in time with respect to clock tick 12a. Similarly, the predetermined time shift is applied to bit 11b of the dibit so that the dibit is delayed in time with respect to clock tick 12b.

Because only time delays can actually be imparted to transitions (i.e., transitions cannot be anticipated before they occur) and because data patterns for an MTR(j=2) code can only contain isolated transitions and dibits, the precompensation scheme described in the preceding paragraphs can be implemented by the following scheme, which is essentially an equivalent approach: (a) do not delay the first transition of a dibit, (b) delay an isolated transition by a predetermined amount, and (c) delay the second transition of a dibit by twice the predetermined amount; only the time reference has changed. Accordingly, the symmetric precompensation technique of the present invention permits higher user data rates to be achieved for a given soft error rate than that achieved by conventional precompensation techniques for an equivalent soft error rate. Of course, to allow for component variations, the delay applied to an isolated transition need not be exactly half that applied to the second transition of a dibit, albeit approximately so.

Because the two transitions of each dibit are moved apart by the precompensation technique of the present invention, consecutive dibits can consequently "collide" in that the (precompensated) time separation between the closest interdibit transitions becomes less than that between two neighboring intradibits transitions, thereby increasing the readback soft error rate. By eliminating consecutive dibits, as well as tribits, from the coded data, the precompensation technique of the present invention enables higher user data rates (at equivalent soft error rate) than a code permitting these patterns. The predetermined time shift, described earlier, for delaying transitions can be chosen so that, when consecutive dibits are eliminated, the closest interbit transition becomes about equal to the distance between two neighboring intradibit transitions.

Figure 2:
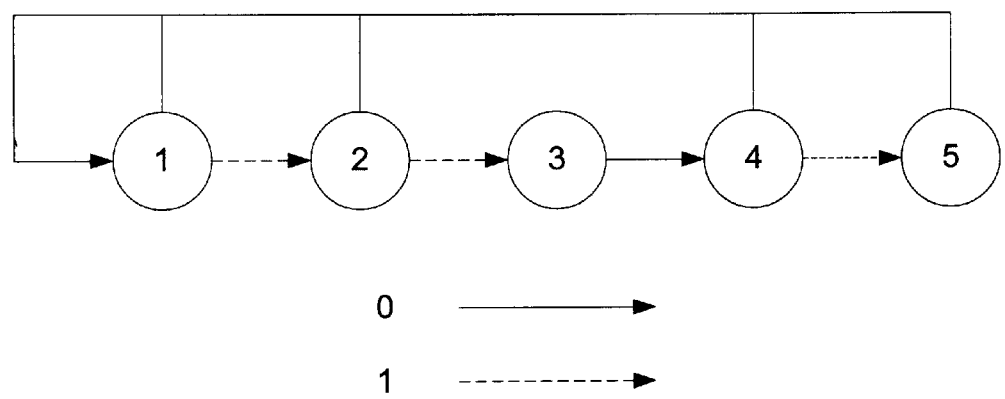
FIG. 2 is a finite state transition diagram (FSTD) that exhibits all sequences that do not contain tribits or consecutive dibits.

FIG. 2 depicts a finite state transition diagram (FSTD) that exhibits all sequences that do not contain tribits and/or consecutive dibits. A code that satisfies this constraint can have a code rate of at most 0.8579. The code rate for a code tat does not contain tribits and/or consecutive dibits is lower than the maximum code rate of 0.8792 for an MFR(j=2) code (i.e., a code that merely forbids tribits). Nevertheless, a code that does not contain tribits and/or consecutive dibits permits construction of very high rate codes. To wit, the present invention provides a rate 8/10 and a rate 16/19≈0.8492 code having the desired properties for precompensation according to the present invention.

The rate 8:10 block code of the present invention can be constructed by first considering the total of 299 potential codes words having a length of 10 that can be generated using the FSTD of FIG. 2 by starting at state 2 and ending at states 1, 2 or 4. The sequences obtained by concatenating these particular code words satisfy the desired constraint. The 19 words in the 299 potential code word list that begin or end with six zeros are discarded. Next, the 23 words in the list that begin with 1001100 or 0110011 or 0011001 are discarded, leaving a list of 257 code words that, when freely concatenated, do not contain tribits or consecutive dibits, and satisfies the RLL (k=10) constraint and the twins (t=6) constraint. It is completely straight forward to determine this list. The RLL(k=10) and the twins (t=6) constraints allow for timing recovery and limited path memory of the Viterbi detector, respectively. Finally, one more codeword can be eliminated, yielding a list of exactly 256 words that can be used for a rate 8:10 block code. The words in this list, when freely concatenated, do not contain tribits or consecutive dibits, and satisfies the RLL (k=10) constraint and the twins (t=6) constraint.

The rate 16:19 code of the present invention forbids tribits and consecutive dibits, satisfies the RLL (k=13) constraint and the twins (t=15) constraint. In order to control complexity as well as decoder error propagation, the present invention uses a time-varying version of the state-splitting algorithm that was introduced by J. Ashley et al. in "Time-Varying encoders for constrained systems: an approach to limiting error propagation," IEEE Trans. Inform. Theory, vol., 46, May 2000. According to J. Ashley et al., the state-splitting algorithm technique yields a time-varying encoder in two alternating phases, one phase at a rate 8:9 and the other phase at a rate 8:10, for an overall rate of 16:19.

Figure 3:
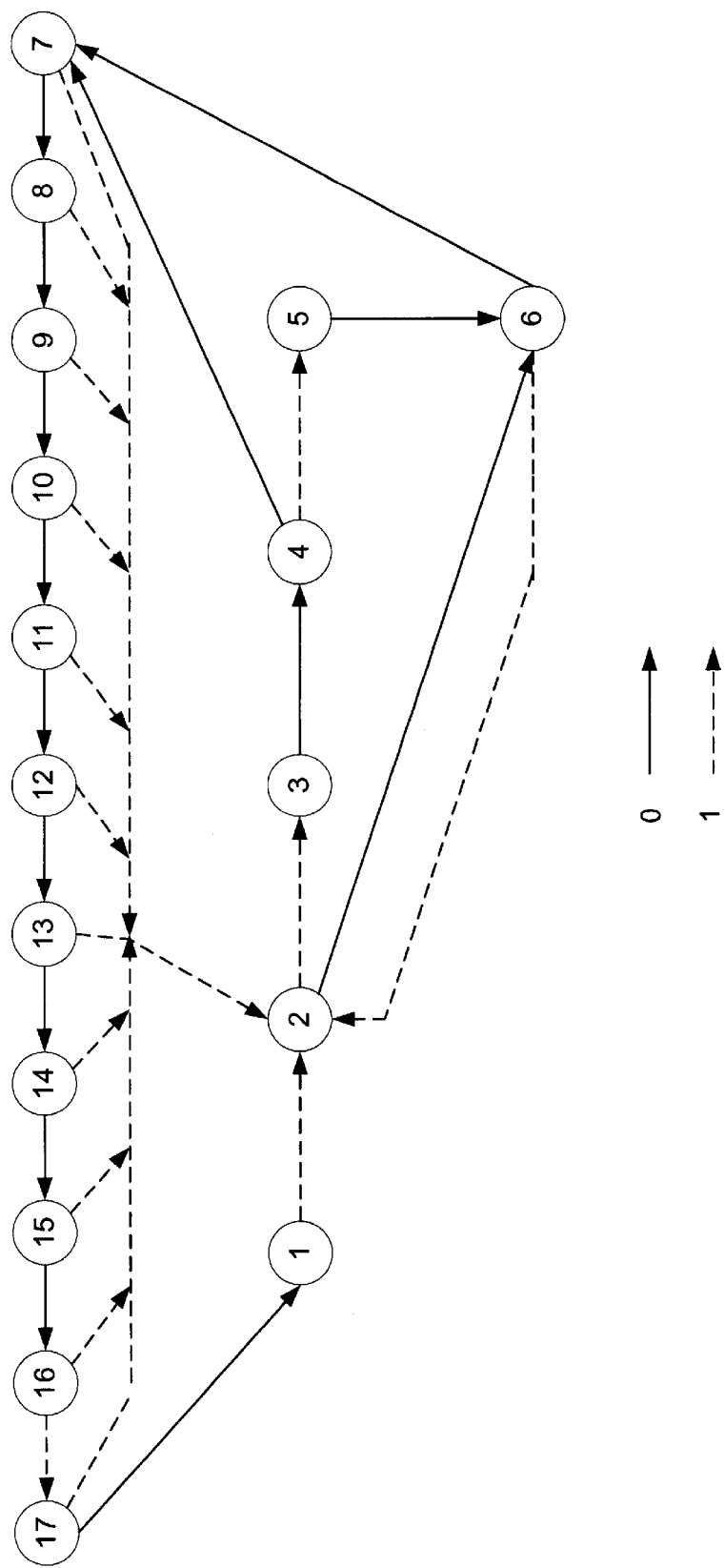
FIG. 3 is a finite state transition diagram that exhibits all sequences that do not contain tribits or consecutive dibits and also satisfies the RLL (k=13) constraint.

Construction begins with the FSTD, shown in FIG. 3, which enables all sequences that do not contain tribits or consecutive dibits and satisfies the RLL (k=13) constraint. From the FSTD shown in FIG. 3, a new "two-phase" FSTD is formed having a state set consisting of two disjoint subsets, $S_0$ and $S_1$, with all outgoing transitions from states in $S_0$ labeled with 9-bit blocks and ending at a state in $S_1$, and all outgoing transitions from states in $S_1$ labeled with 10-bit blocks and ending in a state in $S_0$. These two phases are referred to herein as phase 0 and phase 1. All sequences obtained by traversing the FSTD of FIG. 3 (concatenating strings of alternating 9-bit and 10-bit blocks) do not contain tribits or consecutive dibits, but do satisfy the RLL (k=13) constraints.

The time-varying aspect of the state-splitting algorithm is applied to the FSTD of FIG. 3 and ultimately yields that a new FSTD that, when properly pruned, becomes a time-varying encoder which alternates between the two phases: phase 0 at rate 8:9 and phase 1 at rate 8:10. Pruning involves deletion of excess codewords in order to enforce the twins (t−15) constraint.

There are two sets of encoder states: a first set of three phase 0 encoder states and a second set of four phase 1 encoder states. In phase 0, an 8-bit input is encoded to a 9-bit codeword as a function of the current phase 0 encoder state. The encoder then moves to a phase 1 encoder state, which is determined as a function of the 8-bit input and the current phase 0 encoder state. The phase 1 encoder state becomes the current encoder state, from which the next 8-bit input can be encoded to a 10-bit output leading to a phase 0 encoder state, etc.

Figure 4:
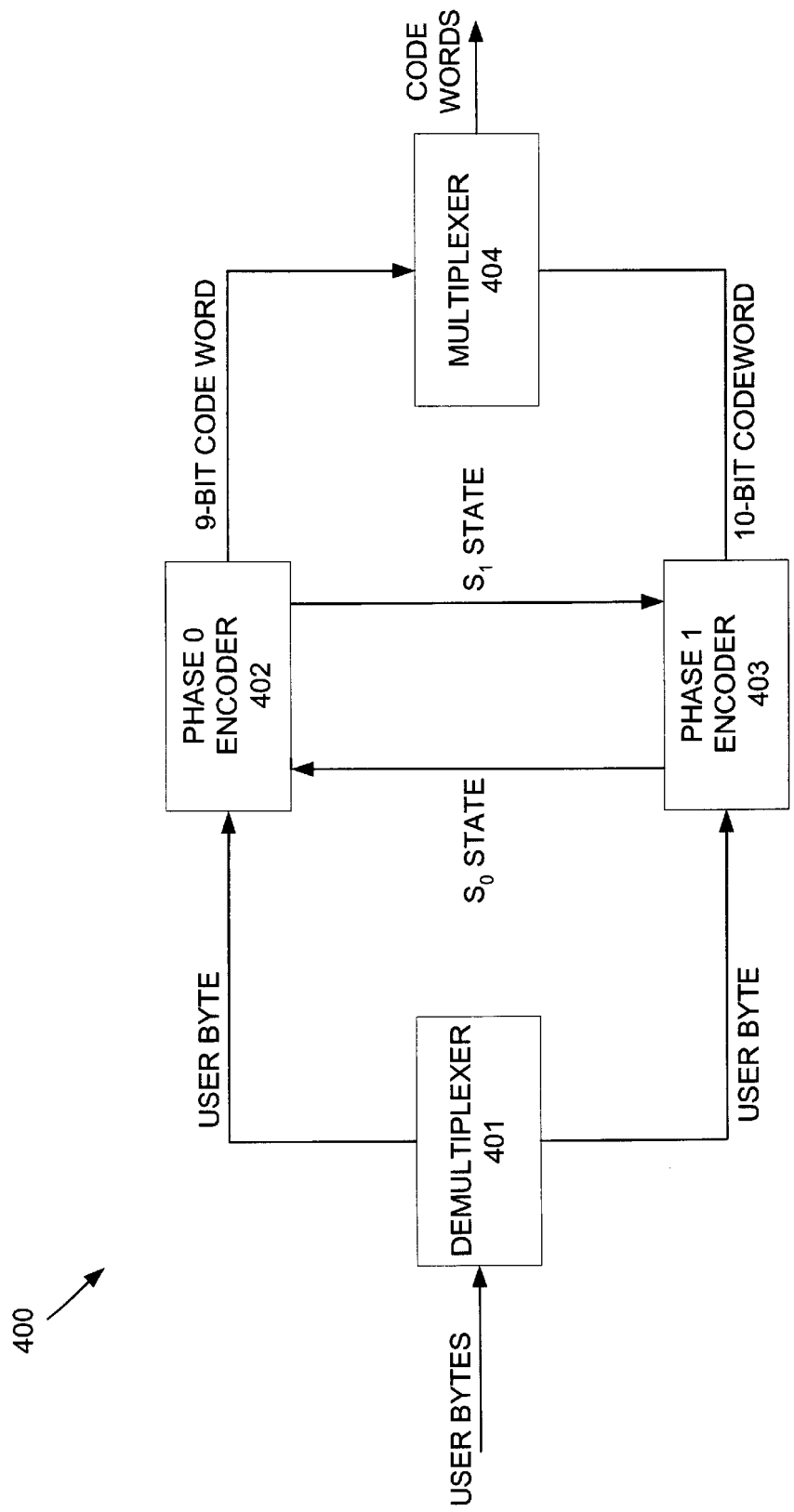
FIG. 4 shows a functional block diagram of a 16:19 encoder according to the present invention.

FIG. 4 shows a functional block diagram of a 16:19 encoder 400 according to the present invention. Encoder 400 includes a demultiplexer 401, a phase 0 encoder 402, a phase 1 encoder 403 and a multiplexer 404. Demultiplexer 401 receives user bytes and directs the received user bytes in an alternating manner to phase 0 encoder 402 and phase 1 encoder 403. Phase 0 402 encoder encodes an 8-bit input into a 9-bit codeword as a function of the current state of phase 0 encoder 402. Encoder 400 then moves to a phase 1 encoder state, which is determined as a function of the 8-bit input and the current phase 0 encoder state. The state of phase 1 encoder 403 becomes the current encoder state, from which the next 8-bit input is encoded to a 10-bit output, leading to a phase 0 encoder state, etc. Multiplexer 404 combines the codewords received from phase encoders 402 and 403 to produce an MTR code having a 16:19 rate.

Figure 5:
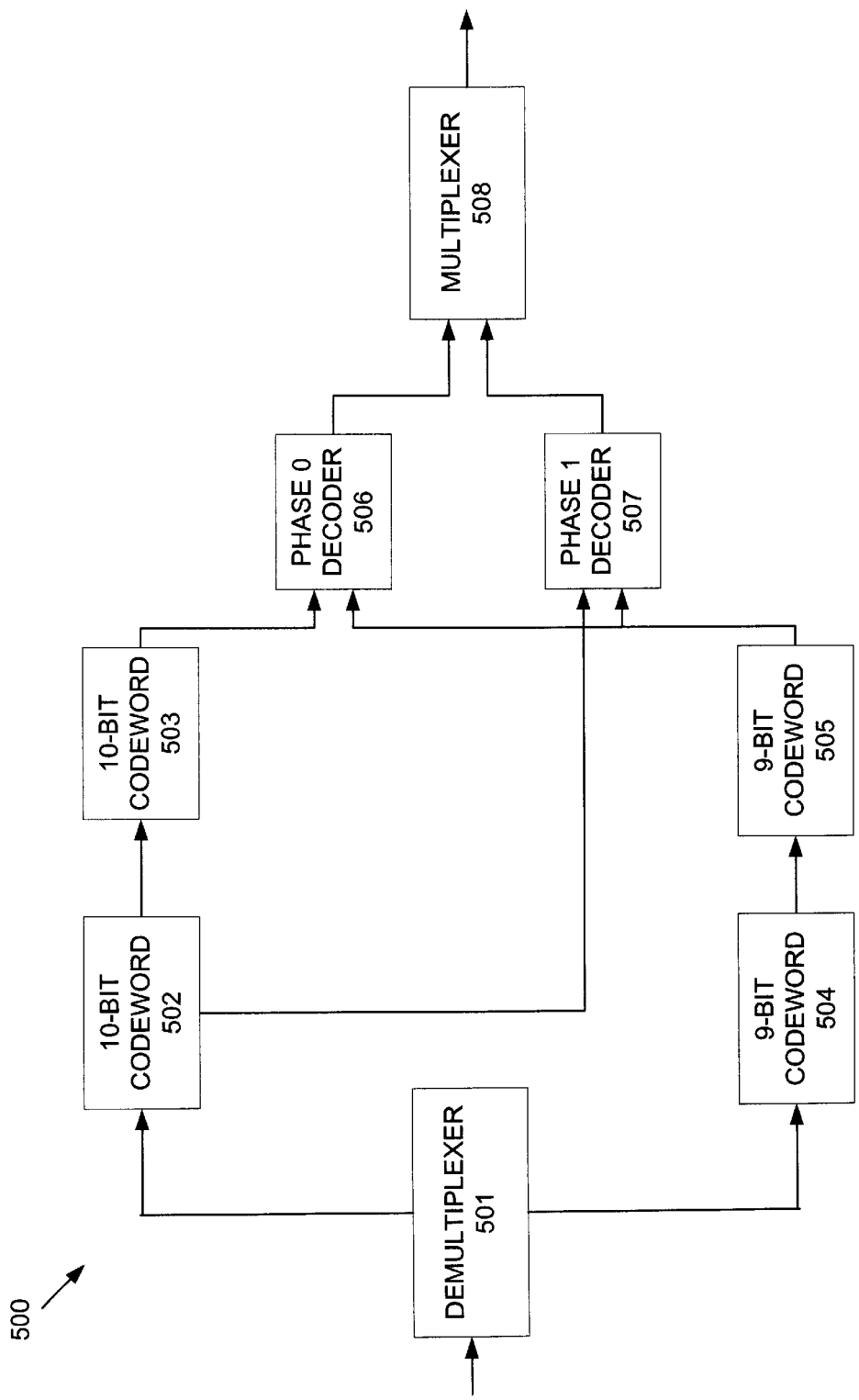
FIG. 5 shows a functional block diagram of a 16:19 decoder according to the present invention.

FIG. 5 shows a functional block diagram of a 16:19 decoder 500 according to the present invention. Decoder 500 includes a demultiplexer 501, a first 10-bit buffer 502, a second 10-bit buffer 503, a first 9-bit buffer 504, a second 9-bit buffer 505, a phase 0 decoder 506, a phase 1 decoder 507 and a multiplexer 508. Decoder 500 is of a sliding block type having a window having two blocks (in a time-varying way, alternately a 9-bit code block followed by a 10-bit code block and a 10-bit code block followed by a 9-bit code block). The respective outputs of decoders 506 and 507 are multiplexed by multiplexer 508.

Finally, there are tradeoffs between the k- and t-constraints for MTR(j=2, c=2) codes. For instance, a rate 16:19 code can be obtained that is similar to the 16:19 code discussed herein with t reduced from 15 to 11 at the expense of increasing k from 13 to 16.

While the present invention has been described in connection with the illustrated embodiments, it will be appreciated and understood that modifications may be made without departing from the true spirit and scope of the invention.

What is claimed is:

1. A method for write-precompensating a waveform for magnetically recording a waveform on a magnetic medium, the method comprising:

encoding a user data stream into an encoded data stream, the encoded data stream having no tribits and having consecutive combinations of dibits separated by a minimum of two 0 symbols;

applying no delay to a first transition of a dibit of the encoded data stream;

delaying an isolated transition of the encoded data stream by a first predetermined amount of time;

delaying a second transition of a dibit of the encoded data stream by a second predetermined amount of time, the second predetermined amount of time being substantially twice the first predetermined amount of time, the first and second predetermined amounts of time being selected so that the closest interdibit transition of the encoded data stream becomes about equal to a distance between two neighboring intradibit transitions of the encoded data stream.

2. The method according to claim 1, wherein the encoded data stream satisfies a predetermined run length limited (RLL) k-constraint and a predetermined twins t-constraint.

3. The method according to claim 2, wherein the k-constraint is k=13.

4. The method according to claim 2, wherein the twins t-constraint is t=15.

5. The method according to claim 2, wherein the user data stream is encoded by a block code at rate 8:10.

6. The method according to claim 2, wherein the user data stream is encoded by a finite-state code at rate 16:19.

7. The method according to claim 6, wherein encoding the user data stream encodes the user data stream based on a time-varying technique that alternates between a first phase and a second phase, the first phase being an 8:9 phase and the second phase being an 8:10 phase.

8. The method according to claim 1, further comprising a step of decoding the encoded data stream using a sliding-block technique having a window consisting of two blocks that alternate between a 9-bit block and a 10-bit block.

9. The method according to claim 8, wherein the sliding-block technique alternates between a 9-bit block followed by a 10-bit block and a 10-bit block followed by a 9-bit block.

* * * * *